United States Patent [19]

Torok et al.

[11] 4,011,550

[45] Mar. 8, 1977

[54] METHOD OF IMPROVING THE OPERATION OF A SINGLE WALL DOMAIN MEMORY SYSTEM

[75] Inventors: Ernest J. Torok; Marlin M. Hanson, both of St. Paul, Minn.

[73] Assignee: Sperry Rand Corporation, New York, N.Y.

[22] Filed: Nov. 28, 1975

[21] Appl. No.: 636,235

[52] U.S. Cl. .................... 340/174 TF; 340/174 S
[51] Int. Cl.² ....................................... G11C 11/14
[58] Field of Search ................... 340/174 TF, 174 S

[56] References Cited

UNITED STATES PATENTS 3,596,261   7/1971   Perneski ..................... 340/174 TF Primary Examiner—James W. Moffitt
Attorney, Agent, or Firm—Kenneth T. Grace; Thomas J. Nikolai; Marshall M. Truex

[57] ABSTRACT

A method of improving the selective positioning of single wall domains or bubbles in a memory system is disclosed. The method includes the use of a predetermined stripline-magnetic layer separation and a drive current signal of a waveform having a relatively high initial amplitude and a relatively decreasing trailing amplitude.

4 Claims, 12 Drawing Figures

STABLE POSITION OF BUBBLE

STABLE POSITION OF BUBBLE WHEN FIELD IS REVERSED.

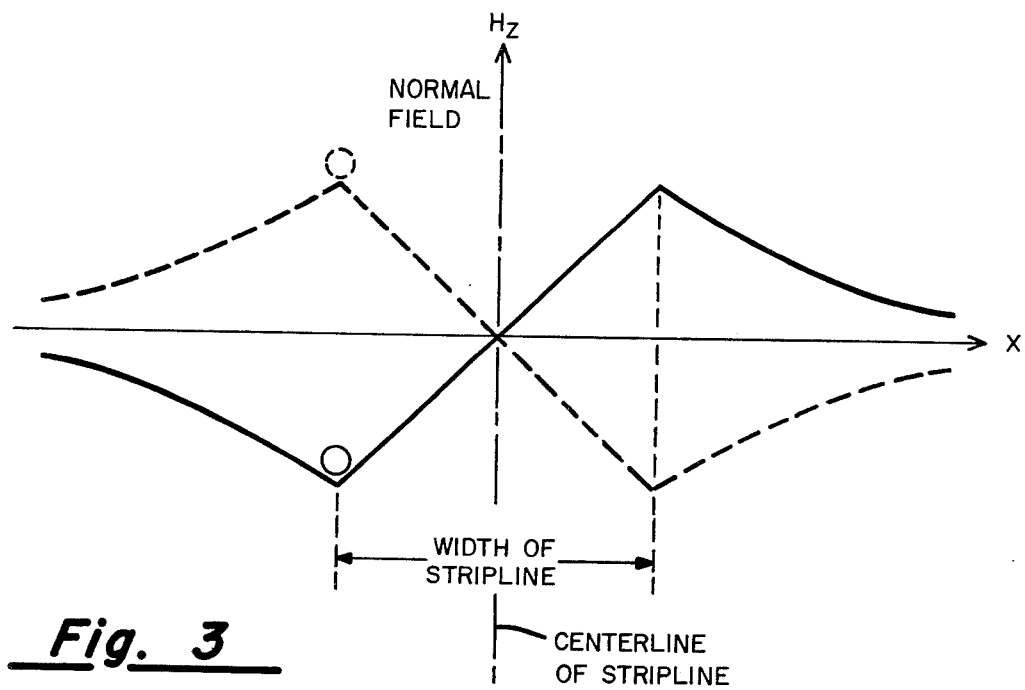
_Fig. 3_
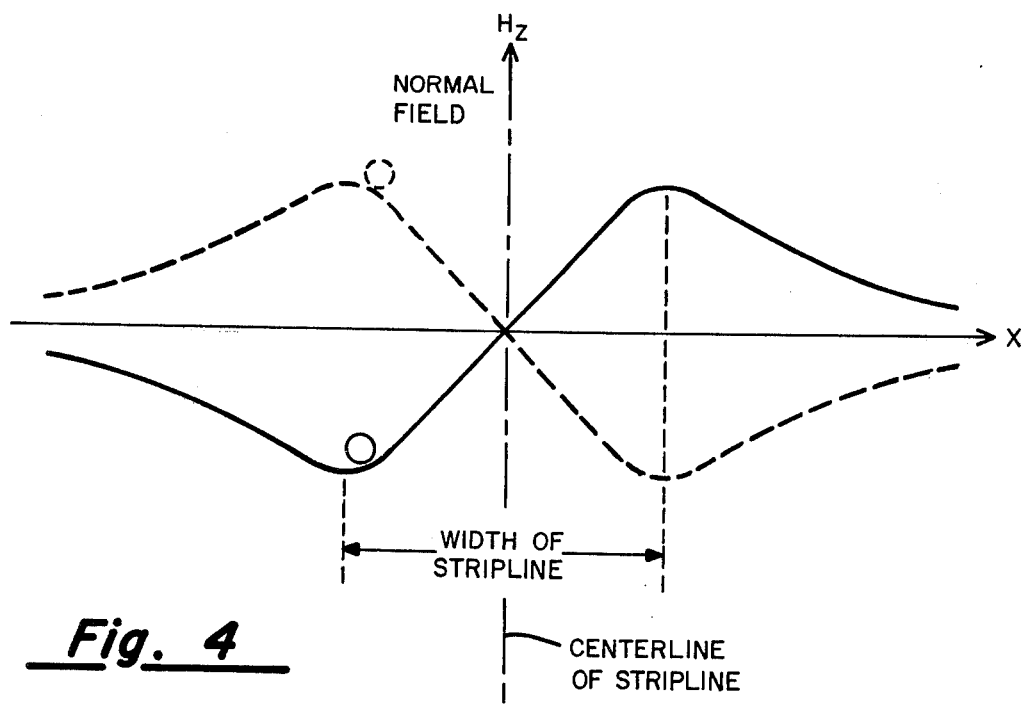
_Fig. 4_

METHOD OF IMPROVING THE OPERATION OF A SINGLE WALL DOMAIN MEMORY SYSTEM

BACKGROUND OF THE INVENTION

In the copending patent application of E. J. Torok, et al., Ser. No. 603,840, having a filing date of Aug. 11, 1975, there is disclosed an optical page composer that is comprised of a magnetizable film layer in which single wall domains or bubbles may be sustained and moved about and to which are inductively coupled a digit line and a perpendicular word line, the intersection of which forms four quadrants that define or are defined by a memory area in the layer. An opaque shield is oriented in the memory area for optically shielding a bubble except when in the first quadrant within the memory area. Coincident current selection, e.g., concurrent half-current selection, of the digit line and of the word line by half-select write signals of the proper polarities permits the one fully selected memory area to be fully selected for the selective writing of a 1 or of a 0 therein, i.e., the associated bubble is selectively positioned in either the first or the third quadrant.

The optical page composer is preferably comprised of a magnetizable film layer of, e.g., garnet, having orthogonal sets of parallel digit lines and parallel word lines, each intersection of which forms four quadrants that define or are defined by an associated memory area with an opaque shield oriented in three of the four quadrants of each memory area. Coincident current selection of a selected one of the digit lines and of a selected one of the word lines by half-select write signals of a first polarity for the writing of a 1 and of a second and opposite polarity for the writing of a 0 permits each separate one of the memory areas to be separately selected for the selective positioning of the associated bubble in either the first quadrant (write 1) or the third quadrant (write 0) of the associated memory area without substantially affecting the bubbles in the half-selected memory areas along the half-selected digit line and word line.

In the operation of such page composer, as during the writing or transferring operation, it has been observed that the bubbles, under certain operating conditions, may escape from their proper stable positions, e.g., the first quadrant, within the memory area, or, alternatively, may become "struck" in one stable position and may not be selectively positioned from one stable position, e.g., the first quadrant, into another stable position, e.g., the third quadrant. The present invention is directed toward a method of ensuring the reliable operation of the page composer of such E. J. Torok, et al., patent application without a modification of the stripline structure thereof, except for a predetermined stripline-magnetic film layer separation.

BRIEF DESCRIPTION OF THE DRAWINGS

FIG. 3 is a diagramatic illustration of the field component $H_z$ that is normal to the film layer of FIG. 1 that is achieved by a stripline that is substantially in contact with the film layer.

FIG. 4 is a diagrammatic illustration of the field component $H_z$ that is normal to the film layer of FIG. 1 that is achieved by a stripline that is spaced a predetermined distance S above the film layer.

DESCRIPTION OF THE PREFERRED EMBODIMENTS

Figure 1:
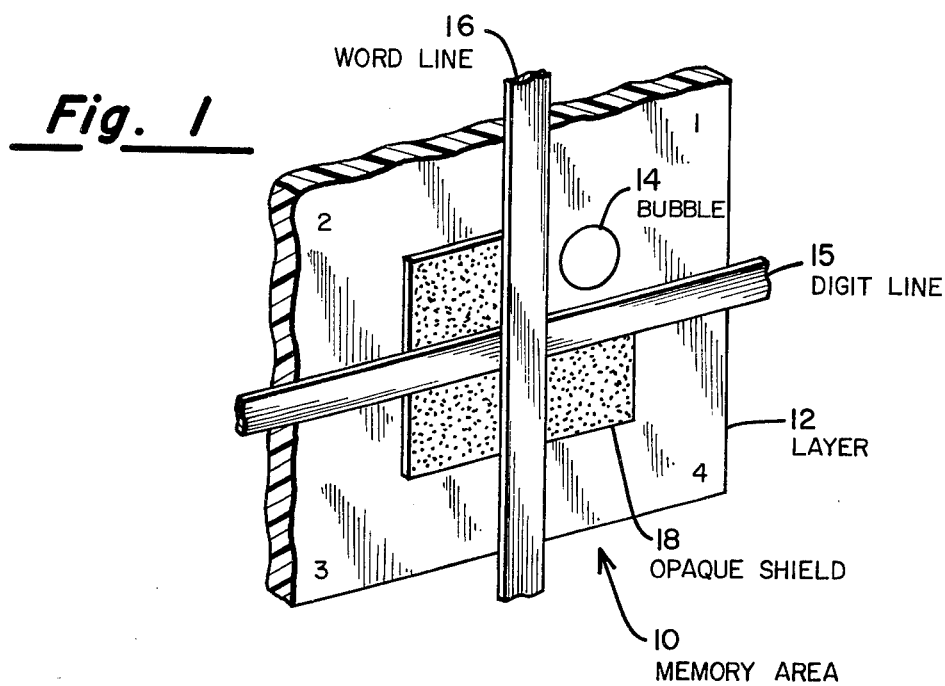
FIG. 1 is a perspective view of one memory area of the page composer into which the present invention is incorporated.

With particular reference to FIG. 1 there is presented a perspective view of one memory area 10 of a page composer that may be similar to that of the hereinabove referenced E. J. Torok, et al., patent application into which page composer the present invention is incorporated. Layer 12 is a planar film layer of magnetizable material in which single wall domains or bubbles 14 may be sustained and moved about. Superposed film layer 12 and parallel to the plane thereof are digit line 15 and word line 16 oriented perpendicular to each other for forming the memory area 10 having the four quadrants 1, 2, 3, 4 that are defined by the intersecting digit line 15 and word line 16. Oriented within the memory area 10, defined by the intersecting digit line 15 and word line 16, is an opaque shield 18 that is oriented in the second, third and fourth quadrants but not in the first quadrant of the memory area 10, all as illustrated and discussed in more detail in the hereinabove referenced E. J. Torok et al., patent application.

Figure 2A:
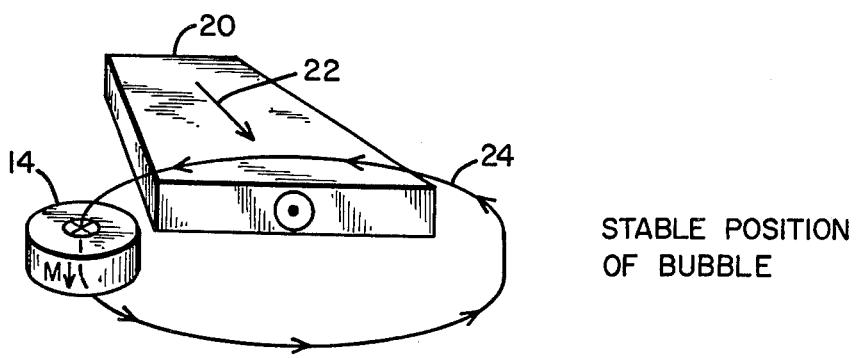
FIGS. 2a and 2b are illustrations of the stable positions of a bubble about a stripline when affected by a magnetic field generated by a current flowing therethrough.
Figure 2B:
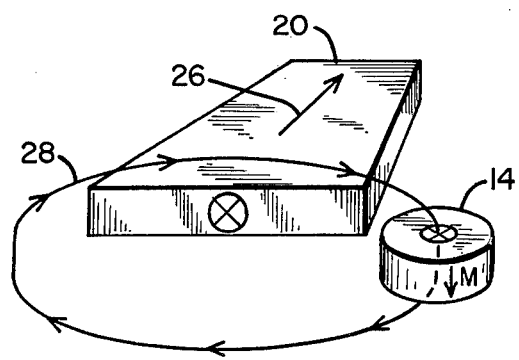

With particular reference to FIGS. 2a and 2b the theory of operation of the memory area 10 of FIG. 1 will now be explained. This operation is based upon the principle that a bubble 14 can be moved by the gradient of a magnetic field $H_z$ that is normal to the planar surface of the magnetizable film layer 12, while bubble 14 moves toward that point in magnetizable film layer 12 where the normal field $H_z$ is of the greatest intensity and is in the direction of the magnetization M within bubble 14. FIG. 2a illustrates the condition when a current signal is coupled to a stripline 20 so as to flow in the direction denoted by vector 22 generating the associated counterclockwise magnetic field denoted by vector 24. As the field normal to magnetizable film layer 12 is of the greatest intensity just outside the edge of the stripline 20, bubble 14 will nestle immediately adjacent to stripline 20. Conversely, when the current flowing in stripline 20 is reversed, as illustrated by the vector 26 in FIG. 2b, the stable position of bubble 14 is on the opposite side of stripline 20. Thus, bubble 14 can be shifted forth and back between the two stable positions along the opposing edges of stripline 20 by reversing the direction of current flow in stripline 20. Since there is a coercivity associated with bubble 14, as with all magnetic domains, bubble 14 remains in either of these two stable positions after termination of the current flow in stripline 20. As discussed hereinabove, the present invention is directed toward a method of improving the operation of the E. J. Torok et al., patent application wherein the two problems of bubble "escaping" and bubble "sticking" have been observed.

Bubble Escaping

When bubble 14 is being transferred forth and back from one side of stripline 20 to the other side, as illustrated and discussed with particular reference to FIGS. 2a and 2b, bubble 14 is sometimes observed to escape from the above discussed stable positions. As discussed with particular reference to FIGS. 2a and 2b, the reversal of the direction of the current flow in stripline 20, as from the direction denoted by vector 22 in FIG. 2a to the direction denoted by vector 26 in FIG. 2b, bubble 14 should be expected to be moved from the stable position of FIG. 2a into the stable position of FIG. 2b passing from one edge of stripline 20 to the other edge thereof. However, observation of the operation of memory area 10 using the Faraday magnetooptic effect has indicated that bubble 14 may, under certain conditions, be repelled away from stripline 20 such as being moved further to the left from stripline 20 as illustrated in FIG. 2a rather than being moved to the right as illustrated in FIG. 2b.

The reason that this "escaping" of the bubble 14 may occur can be explained with particular reference to FIG. 3 wherein there is illustrated a diagramtic illustration of the field component $H_z$ normal to the film layer 12 of FIG. 1 achieved by stripline 20 when substantially in contact with film layer 12. FIG. 3 illustrates the normal field component, $H_z$, from stripline 20 as a function of the distance X from the center of stripline 20 along the surface of film layer 12. It is this normal field $H_z$ that is responsible for moving bubble 14 with respect to stripline 20 wherein the magnetomotive force on bubble 14 is proportional to the slope of the normal field $H_z$. The mechanical analogy is that of a ball rolling down hill; the potential energy of bubble 14 is proportional to the heights of the "hill" of the normal field $H_z$ as illustrated in FIG. 3. When the current in stripline 20 is reversed, as illustrated in FIGS. 2a and 2b, the valleys become peaks and correlatively the peaks become valleys wherein bubble 14 is supposed to "roll down hill" to the other side of stripline 20. However, as illustrated in FIG. 3, there is the other possibility that bubble 14 can "roll" down the other side of the "hill," i.e., move to the left of FIG. 3 and be repelled from stripline 20. Bubble 14, as depicted by the dashed circle in FIG. 3, is in this position of unstable equilibrium wherein bubble 14 may "roll" down either side of the "hill," to move to the right to the other side of stripline 20 or, alternatively, to move to the left to be repelled from stripline 20.

Bubble Sticking

The second problem observed in the operation of the memory area of FIG. 1 is that the bubble 14 may become "stuck" in one of its stable positions, as illustrated in FIGS. 2a and 2b, and will not return to the other side of stripline 20 when subjected to a normal drive field unless multiple pulses or a single pulse of a larger amplitude is utilized. This problem can be understood by introducing the concept of the coercive field $H_C$ as follows.

The coercive field $H_C$ of a domain wall is that field that is necessary to move the domain wall across various film imperfections and inhomogeneities. The average field tending to move bubble 14 is the difference between the two fields on opposite sides of bubble 14; if the average width of bubble 14 is represented by W, then this difference is approximately $$H_0 = \frac{dH_z}{dx} W. \tag{1}$$

Figure 5:
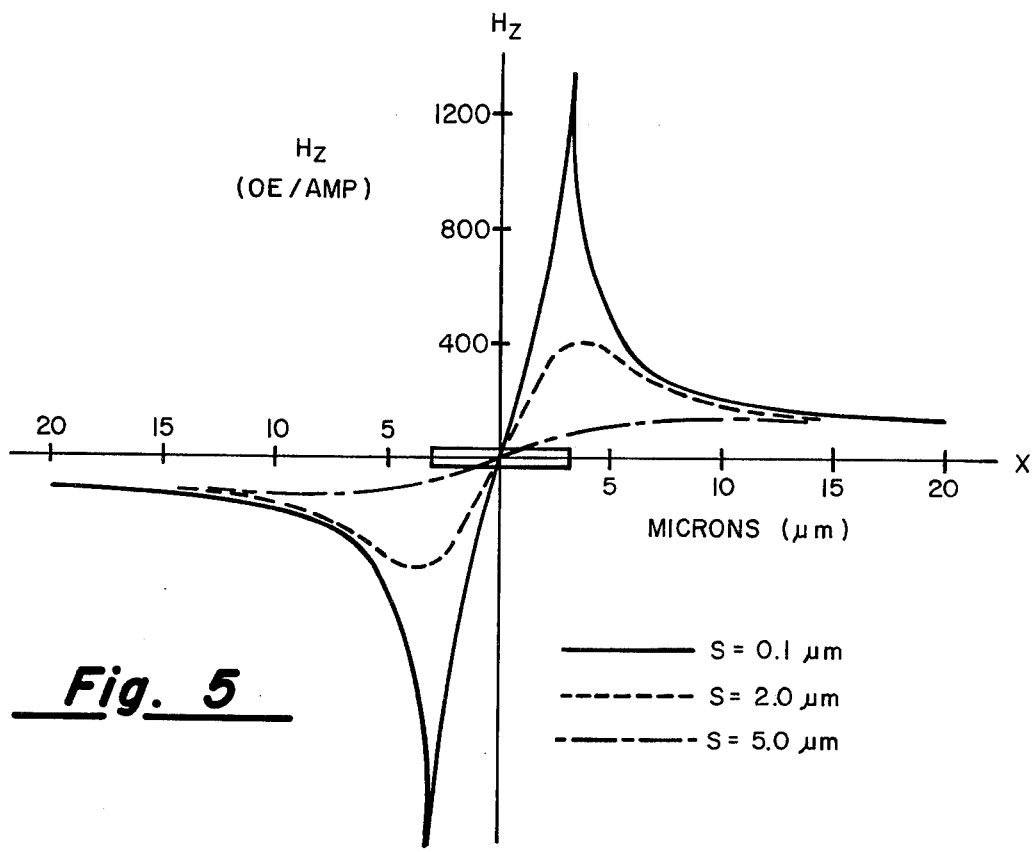
FIG. 5 is a graph of the field component $H_z$ that is normal to the film layer of FIG. 1 that is achieved by a stripline that is spaced a predetermined distance S above the film layer for three distances S.

If this quantity is larger than the coercive force $H_C$, bubble 14 moves; otherwise, the bubble will not move and will become "stuck." Now, consider the case depicted in FIG. 4 wherein there is illustrated a diagramatic illustration of the field component $H_z$ normal to film layer 12 of FIG. 1 that is achieved by a stripline 20 that is spaced a distance S above the film layer 12. Note that FIG. 5 is a graph of experimental data of the field component $H_z$ that is normal to the film layer of FIG. 1 for the three stated distances S. This slight separation of the stripline 20 above the surface of film layer 12 smoothes out the peaks and the valleys in the normal field $H_z$ graph as illustrated in FIG. 3. Under the conditions defined by FIG. 4, when bubble 14 has been moved or propagated under stripline 20, such as illustrated in FIGS. 2a, 2b, bubble 14 will come to rest at a stable position at the point $X_0$ where $$\frac{dH_z}{dx}(X_0)W - H_C = 0. \tag{2}$$

Now, when the polarity of the current in stripline 20 is reversed, the normal field $H_z$ then tends to push bubble 14 in the opposite direction; however, the normal field $H_z$ is opposed by the coercivity $H_C$ such that the net force on bubble 14 is $$\frac{dH_z}{dx}(X_0)W - H_C = 0.$$

Therefore, under these stated conditions bubble 14 does not move from its stable position. Now, if the current flowing in stripline 20 is increased in amplitude only an infinitesimal amount, bubble 14 will move to the opposite side of stripline 20; however, each time bubble 14 is moved or propagated from one edge of stripline 20 to the other edge, the current required to move it again increases in amplitude. This increase in the amplitude of the current flowing in stripline 20 that is required to move or propagate bubble 14 from one edge of stripline 20 to the other edge on each successive transfer operation is, of course, unsatisfactory for normal operation as a memory device.

Solution

Figure 6:
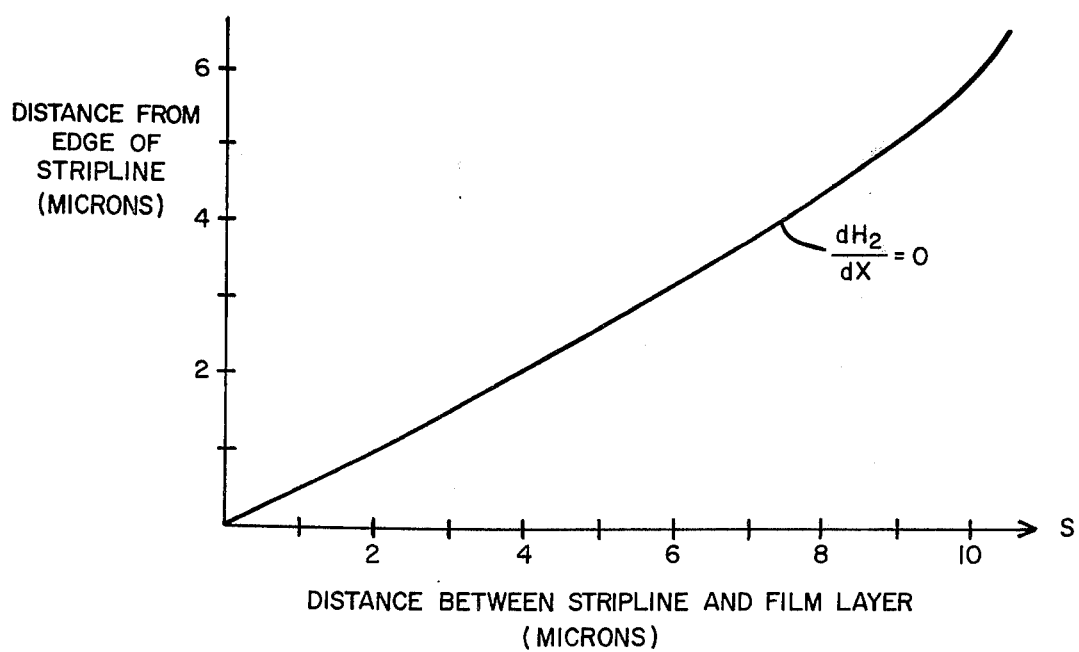
FIG. 6 is a plot of the zero change of the field component $H_z$ for a change in distance X away from the edge of the stripline.

The solution to the above described two problems of bubble escaping and bubble sticking, as proposed by the present invention, includes two essential coacting elements: a time decaying drive current pulse; and, a predetermined stripline - film layer separation. The method of the present invention, accordingly, (1) raises the stripline 20 slightly above the surface of the film layer 12 a predetermined distance S to ensure the generation of the rounded peaks in the graph of the normal field $H_z$ component as illustrated in FIG. 4 and (2) applies a time decaying drive current pulse as, e.g., in FIG. 7 rather than the square pulse as utilized by the hereinabove referenced E. J. Torok et al., patent application. FIG. 6 is presented to illustrate a plot of the zero change of the field component $H_z$ for a change in the distance X away from the edge of the stripline. This plot illustrates that the peak or maximum amplitude of the filed component $H_z$ moves away from the center of the stripline with an increase in the distance S between the stripline and the film layer.

With a stripline 20 of a width D of 6 microns ($\mu m$) and separated a distance S of 2 $\mu m$ above the top planar surface of film layer 12, bubble 14 requires approximately 600 nanoseconds (ns) to cross under stripline 20 from a first stable position, as in FIG. 2a, to a second stable position, as in FIG. 2b. If the amplitude of the drive current pulse that caused bubble 14 to move from the first stable position into the second stable position is of a lower magnitude after bubble 14 has gone half way between such first stable position and the second stable position, i.e., under the longitudinal center line of stripline 20, bubble 14 will come to rest at a second stable position at a point that is slightly nearer the center of stripline 20 than if a square drive current pulse were used as in the hereinabove referenced E. J. Torok, et al., patent application and as illustrated in FIG. 3. Now, when a new drive current pulse is coupled to stripline 20 to transfer bubble 14 back into its original first stable position from its second stable position, bubble 14 does not "stick" in the second stable position because bubble 14 experiences a stronger, or more intense, drive field than at the time or when bubble 14 had come to rest in the second stable position.

Figure 7A:
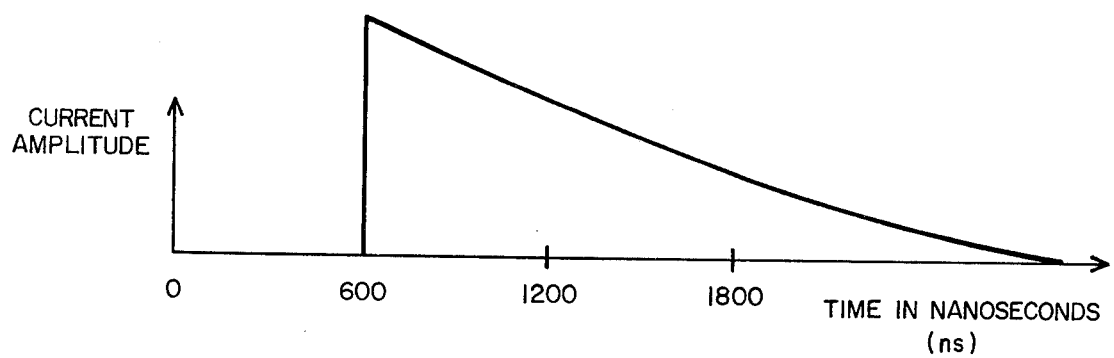
FIGS. 7a, 7b, 7c are illustrations of typical drive field waveforms that may be used to practice the present invention.
Figure 7B:
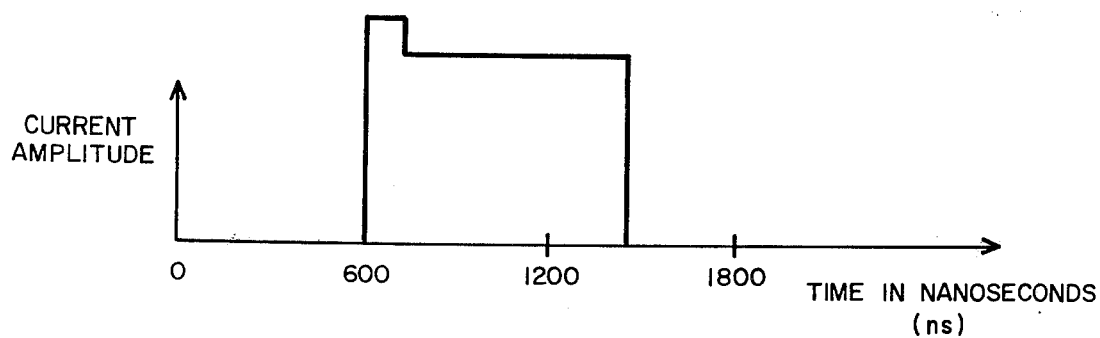
Figure 7C:
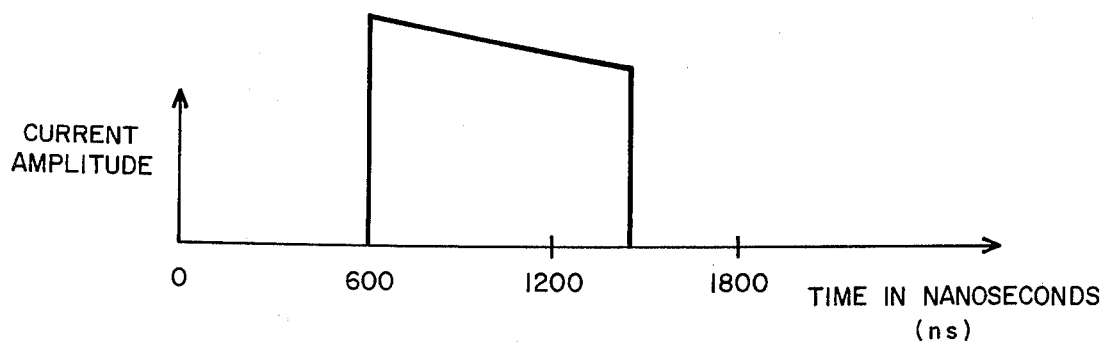

The quantitative analysis of this operation is as follows: Let the waveform of the drive current pulse be as illustrated in FIGS. 7a, 7b, or 7c, and let the amplitude of the drive current pulse decay so that 600 ns after the drive current pulse was initiated or turned on, as at a time $t_1$, the amplitude of the drive current pulse is 90% of its initial amplitude.

$$.90 \frac{dH_z(0,X)}{dx} = \frac{dH_z}{dx}(600,X). \quad (3)$$

The bubble 14 will then come to rest at its second stable position as at the point $X_1$ where the slope of the normal field $H_z$ is given by the equation $$\frac{dH_z}{dx}(600,X_1) = (.90)\frac{dH_z}{dx}(0,X_1) = H_c. \quad (4)$$

When at a time $t_2$ a new drive current pulse is coupled to stripline 20 to transfer bubble 14 back to its original first stable position, the amplitude of the drive current pulse is again high, and $$\frac{dH_z(t_2,X_1)}{dx} = \frac{-dH_z(0,X_1)}{dx} \quad (5)$$

$$\frac{-dH_z(t_2,X_1)}{dx} = \frac{1}{.90} H_c > H_c. \quad (6)$$

Thus, the magnetomotive force that is coupled to bubble 14 by the coacting time decaying drive current pulse and the separated stripline 20 and film layer 12 is 11% greater than that which is required to overcome the coercive force $H_c$ of the single domain wall of bubble 14. Thus, bubble 14 is forced to move from its second stable position back into its first stable position upon the application of the drive current waveforms of FIGS. 7a, 7b, 7c. Accordingly, the use of a coacting time decaying drive current pulse and a proper stripline 20 — film layer 12 separation precludes bubble 14 from sticking in its first or its second stable position while concurrently preventing bubble 14 from being repelled from stripline 20, but to be reliably transferred forth and back from its two stable positions.

Figure 8:
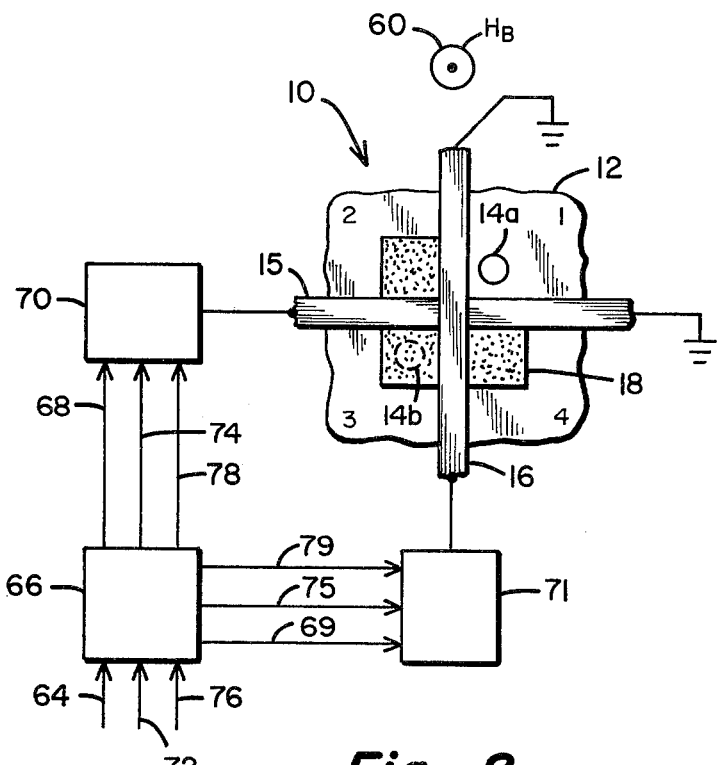
FIG. 8 is a schematic illustration of the memory area of FIG. 1 including the necessary word and digit drivers.
Figure 9:
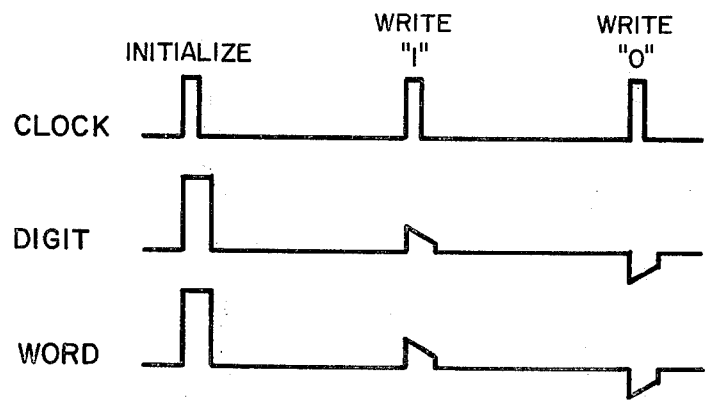
FIG. 9 is an illustration of the timing and waveform relationships, per FIG. 7c, that are associated with the operation of the memory area of FIG. 8.

With particular reference to FIG. 8 there is presented a schematic diagram of a bubble memory system incorporating the present invention in which bubble 14 in the memory area 10 defined by the intersection of digit line 15 and word line 16 may be selectively affected by half-select write digit and word drive current signals to be selectively positioned in the first quadrant — represented by bubble 14a — representative of the storage of a 1 or in the third quadrant — represented by bubble 14b — representative of the storage of a 0. Provided is a bias field $H_B$ as represented by the circle 60, which implies a field directed upwardly normal to the plane of film layer 12 of the magnetizable material in which single wall domains or bubbles 14 may be sustained and moved about 13 such bias field $H_B$ may be provided by a configuration of Helmholtz coils such as illustrated in the A. H. Bobeck U.S. Pat. No. 3,534,347. Using the timing and waveform diagram of FIG. 9, a bubble 14 may be generated at the digit line 15, word line 16 intersection by an initialize enable signal on line 64 causing timing and control circuitry 66 to, via lines 68, 69, cause digit driver 70 and word driver 71 to couple the appropriate current signal amplitudes to their associated digit line 15 and word line 16, respectively.

With a bubble 14 initially established in the memory area 10 defining digit line 15, word line 16 intersection, the selective positioning of bubble 14 at memory area 10 may now be selectively written in the 1 state denoted by the bubble 14a being positioned in the upper righthand first quadrant or alternatively written into the 0 state by the bubble 14b being positioned in the lower lefthand third quadrant and superposed the opaque layer 18. This operation is typical of all coincident current, i.e., bit select, memory operation.

A write enable signal on line 72 or 76 causes timing and control 66 to couple the appropriate timing pulse to the corresponding lines 74, 75 or 78, 79 such that the energized digit line driver 70 and the energized word line driver 71 each couple their associated one-half select current signal to their associated digit line 15 and word line 16. As an example, with the digit line 15 and the word line 16 superposed above film layer 12 and using the well-known right-hand rule, if memory area 10 is to be written into a 1 state, digit line driver 70 must couple a positive half-select current pulse to its associated digit line 15 while, concurrently, word line driver 71 must couple a negative half-select current pulse to its associated word line 16. Correspondingly, it is apparent that if such memory area 10 is to be written into a 0 state, digit line driver 70 must couple a negative half-select current pulse to its associated digit line 14 while word line driver 71 must couple a positive half-select current pulse to its associated word line 15. This coincident current selection and writing of bubble 14 into the 0 or 1 state is similar to that discussed in the hereinabove referenced E. J. Torok et al., patent application.

What is claimed is:

1. In a bubble memory system including a planar layer of a magnetizable material in which single wall domains or bubbles may be sustained and moved between first and second stable positions in said layer, which stable positions are associated with an inductively coupled stripline, by a drive current signal that is coupled to said layer by said stripline, the method of preventing said bubbles from escaping from the magnetomotive effect of said drive current signal to transfer said bubbles between said first and second stable positions or from sticking in either said first or second stable position, comprising:

separating said stripline a predetermined distance S from the top surface of said layer for rounding off the peaks of the normal field $H_z$ component that is inductively coupled to said layer by the drive current signal that is coupled to said stripline; and, coupling to said stripline a drive current signal of a waveform having an initially relatively high signal amplitude that is followed by a relatively lower signal amplitude.

2. The method of claim 1 in which the amplitude of said drive current signal at the time T that is required to transfer one of said bubbles between said first and said second stable positions is no greater than 90% of the initial amplitude.

3. The method of claim 1 in which the initial amplitude of said drive current signal exerts a magnetomotive force $H_F$ upon one of said bubbles, when at rest in said first or said second stable position, that is greater than the coercive force $H_C$ of the domain wall that is associated with said one bubble.

4. The method of claim 1 in which said separation S is less than 33% of the width D of said stripline.

* * * * *